United States Patent
Yoon

(10) Patent No.: US 6,777,326 B2
(45) Date of Patent: Aug. 17, 2004

(54) METHOD FOR FORMING MULTI-LAYER METAL LINE OF SEMICONDUCTOR DEVICE

(75) Inventor: Jun Ho Yoon, Chungcheongbuk-do (KR)

(73) Assignee: Hynix Semiconductor, Inc., Ichon-shi (KR)

( * ) Notice: Subject to any disclaimer, the term of this patent is extended or adjusted under 35 U.S.C. 154(b) by 0 days.

(21) Appl. No.: 10/330,060

(22) Filed: Dec. 30, 2002

(65) Prior Publication Data

US 2003/0129830 A1 Jul. 10, 2003

(30) Foreign Application Priority Data

Jan. 9, 2002 (KR) ......................................... 2002-1201

(51) Int. Cl.$^7$ ............................................. H01L 21/44
(52) U.S. Cl. .................................... 438/652; 438/622
(58) Field of Search ............................... 438/709–727, 438/691, 765, 778–780, 622–629, 652–656, 671–675

(56) References Cited

U.S. PATENT DOCUMENTS 5,783,101 A * 7/1998 Ma et al. ...................... 216/68
5,854,126 A * 12/1998 Tobben et al. ............... 438/626
6,420,251 B1 * 7/2002 Elmadjian et al. .......... 438/597

FOREIGN PATENT DOCUMENTS

KR          0230392        8/1999

* cited by examiner

Primary Examiner—Matthew Smith
Assistant Examiner—Calvin Lee
(74) Attorney, Agent, or Firm—Jacobson Holman PLLC

(57) ABSTRACT

The present invention discloses a method for forming a multi-layer metal line of a semiconductor device, including the steps of: (a) forming a first insulating film having a low dielectric constant on a semiconductor substrate having a lower metal line thereon; (b) forming and planarizing a first oxide film on the first insulating film; (c) etching back the first oxide film and the first insulating film until a predetermined thickness of first insulating film remains on the lower metal line; (d) forming and planarizing a second insulating film having a low dielectric constant on the entire surface of the resulting structure; (e) forming a second oxide film on the second insulating film; (f) selectively etching the second oxide film and the first and the second insulating films to form a via contact hole exposing the lower metal line; (g) forming an adhesive film/diffusion barrier film on the entire surface of the resulting structure; and (i) forming a contact plug filling the via contact hole, and forming an upper metal line contacting the contact plug. As a result, the whole process is simplified, the property of the device is improved, and the high integration of the device is achieved.

13 Claims, 4 Drawing Sheets

METHOD FOR FORMING MULTI-LAYER METAL LINE OF SEMICONDUCTOR DEVICE

BACKGROUND OF THE INVENTION

1. Field of the Invention

The present invention relates to a method for forming a multi-layer metal line of a semiconductor device, and in particular to an improved method for forming a multi-layer metal line of a semiconductor device wherein an insulating film having a low dielectric constant is used in a formation process of an interlayer insulating film of the multi-layer metal line to improve characteristics and reliability of the device.

2. Description of the Background Art

In general, a line of a semiconductor device for electrically connecting devices or device to an external circuit is formed by filling a contact hole and a via hole for interconnection with a line material to form a line layer, and performing subsequent processes. In particular, a metal line is used in a region where a low resistance is required.

The metal line is formed by filling the contact hole and the via hole with the line material, such as an aluminum alloy containing aluminum and a small amount of silicon and/or copper which has a low resistance and excellent processing characteristics according to sputtering of physical vapor deposition (PVD).

Due to a high integration tendency of the semiconductor device, in a process formation of a metal line, a low-K material layer having a low dielectric constant is formed as an interlayer insulating material to reduce resistance capacitance delay by spin coating, and a via hole for connecting an upper line to a lower line is formed, and filled the via hole to form a tungsten contact plug.

Here, since the insulating film is non-uniformly coated on the metal line by the spin-coating process, the thickness of the insulating film depends on a width and density of the metal line therebelow.

An inter-capacitance value between the upper metal line and the lower metal line varies due to non-uniform thickness according to the width and density of the metal line, which deteriorates characteristics of the device.

Moreover, bowing phenomenon occurs during a dry etching process of the via hole, which complicates etching conditions, and the bowing on the sidewalls of the via hole makes deposition of an adhesive film and a diffusion barrier film difficult, which complicates a subsequent process, namely a formation process of a tungsten contact plug.

Furthermore, the end of the metal line is shorted and rounded due to a proximate effect during the patterning process of the metal line, which reduces process margin in a via contact etching process. As a result, the characteristics of the device are deteriorated.

FIGS. 1a to 1e are cross-sectional views illustrating a conventional method for forming a multi-layer metal line of a semiconductor device.

Referring to FIG. 1a, a lower metal line 13 is formed on a semiconductor substrate 11. Here, the lower metal line 13 is composed of an aluminum alloy, and has Ti or Ti/TiN stacked layer at the upper and lower portions of the lower metal line 13.

Reference numeral 100 denotes a region where the area of the lower metal line varies, and reference numeral 200 denotes a region where the density of the lower metal line varies. That is, a metal line having a large area is formed at the left side of region 100, and a metal line having a small area is formed at the right side thereof. A density of the metal line at the left side of the region 200 is relatively higher than that of the right side thereof.

Thereafter, an insulating film 15 having a low dielectric constant is formed on the entire surface. Here, the insulating film 15 is formed according to spin coating using a material having a dielectric constant of about 3.

Although the insulating film 15 has an excellent filling property between metals, namely high step coverage, it is not uniformly coated on the metal line due to its adhesiveness, but unevenly coated on the metal line depending on a width and density of the metal line.

In general, the insulating film 15 is coated thicker on the metal line having the larger area than on the metal line having the smaller area, and in the region having high metal line density than the region having low metal line density.

Thereafter, an oxide film 17 is deposited on the insulating film 15 according to plasma enhanced chemical vapor deposition (PECVD).

Here, the oxide film 17 is formed using a material having a dielectric constant of about 4 at a thickness ranging from 5000 to 12000 Å.

A chemical mechanical polishing (CMP) is performed on the oxide film 17 to form an interlayer insulating film having a stacked structure of the insulating film 15 and the oxide film 17.

As shown in FIG. 1b, a photosensitive film pattern 19 is formed on the interlayer insulating films 15 and 17.

Here, the photosensitive film pattern 19 is formed according to exposure and development processes using a via contact mask (not shown).

As illustrated in FIG. 1c, a via contact hole 21 exposing the lower metal line 13 is formed by etching the interlayer insulating films 17 and 15 using the photosensitive film pattern 19 as a mask.

Since an etch selectivity ratio of the insulating film 15 is at least 1.5 times higher than the etch selectivity ratio of the oxide film 17, the insulating film 15 which is thicker is laterally etched.

The residual photosensitive film pattern 19 is removed after the etching process, and a Ti/TiN film 23 which is an adhesive layer/diffusion barrier film is formed on the entire surface of the resulting structure including the via contact hole 21.

As depicted in FIG. 1d, a tungsten layer 25 for contact plug is formed on the entire surface of the resulting structure according to the PECVD to contact the lower metal line 13 through the via contact hole 21.

Here, bowing is generated in the laterally-etched portion of the insulating film 15 as shown in @.

As described above, in the conventional method for forming the multi-layer metal line of the semiconductor device a bowing phenomenon in the subsequent process because the insulating film having the high etch selectivity ratio is laterally etched during the via contact etching process, thereby deteriorating the property and reliability of the device.

SUMMARY OF THE INVENTION

Accordingly, it is an object of the present invention to provide a method for forming a multi-layer metal line of a semiconductor device which can easily form the sufficient multi-layer metal line for high integration of the semiconductor device by forming a presumed via contact plug without generating bowing.

In order to achieve the above-described object of the invention, there is provided a method for forming a multi-layer metal line of a semiconductor device, including the steps of: (a) forming a first insulating film having a low dielectric constant on a semiconductor substrate having a lower metal line thereon; (b) forming and planarizing a first oxide film on the first insulating film; (c) etching back the first oxide film and the first insulating film until a predetermined thickness of first insulating film remains on the lower metal line; (d) forming and planarizing a second insulating film having a low dielectric constant on the entire surface of the resulting structure; (e) forming a second oxide film on the second insulating film; (f) selectively etching the second oxide film and the first and the second insulating films to form a via contact hole exposing the lower metal line; (g) forming an adhesive film/diffusion barrier film on the entire surface of the resulting structure; and (i) forming a contact plug filling the via contact hole, and forming an upper metal line contacting the contact plug.

On the other hand, the principle of the present invention will now be explained.

An insulating film having a low dielectric constant is coated, an oxide film is deposited low thereon and then planarized according to CMP, an etch back process is performed thereon by using an etch speed difference, a thickness of the insulating film non-uniformly formed on the metal line according to a width and density of the metal line is minimized, an insulating film having a low dielectric constant is re-formed according to spin coating, and a thin oxide film is formed thereon, thereby maintaining a constant thickness of the insulating film on the metal line, and maintaining a small thickness of oxide film on the interlayer insulating film including the insulating film (dielectric constant. approx. 0.3) and the oxide film (dielectric constant. approx. 0.4). Accordingly, a thickness of the relatively-planarized insulating film is increased so that an inter-capacitance between the upper metal line and the lower metal line can be constantly maintained lower than the existing interlayer insulating film regardless of the width and density of the lower metal line.

In addition, the thickness in the insulating film is constant in a plasma dry etching process for forming a via contact hole, which is advantageous in etching condition setup, and bowing is prevented by applying a condition for forming a polymer on the sidewalls of the via contact hole to the insulating film etching condition, thereby easily forming a tungsten contact plug.

That is, the bowing is prevented by forming the interlayer insulating film including the insulating film and the oxide film mostly with the insulating film, forming the oxide film on the surface thereof, and performing the via contact etching process on the resulting structure, thereby stabilizing the subsequent via contact process.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a multi-layer metal line of a semiconductor device in accordance with a preferred embodiment of the present invention will now be described in detail with reference to the accompanying drawings.

FIGS. 2a to 2d are cross-sectional views illustrating sequential steps of the method for forming the multi-layer metal line of the semiconductor device in accordance with the preferred embodiment of the present invention.

Figure 1A:
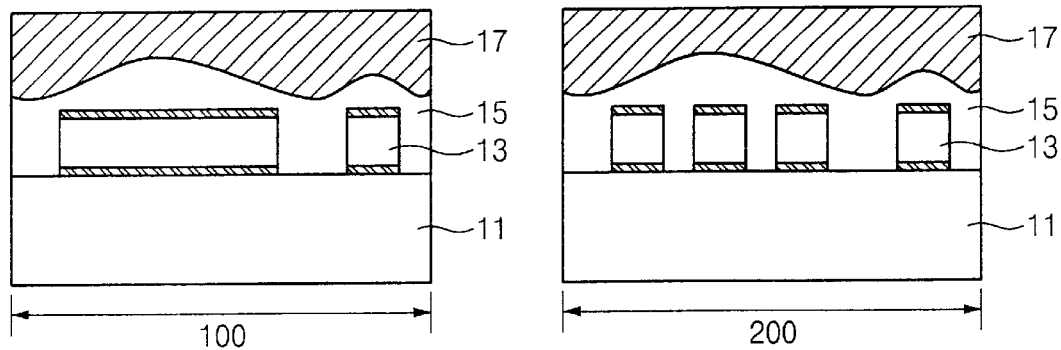
FIGS. 1a to 1d are cross-sectional views illustrating sequential steps of a conventional method for forming a multi-layer metal line of a semiconductor device.
Figure 1B:
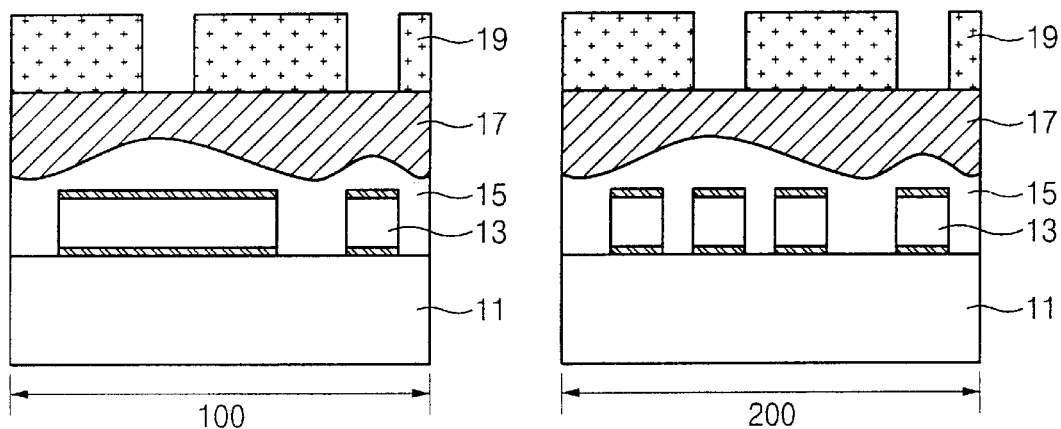
Figure 1C:
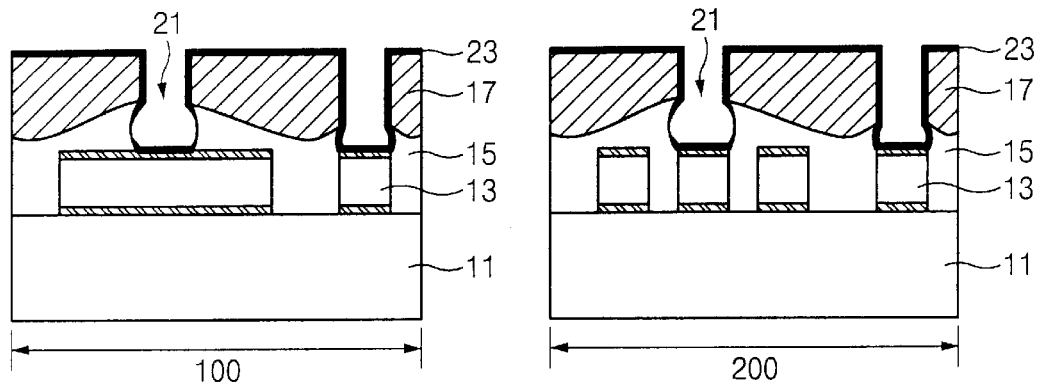
Figure 1D:
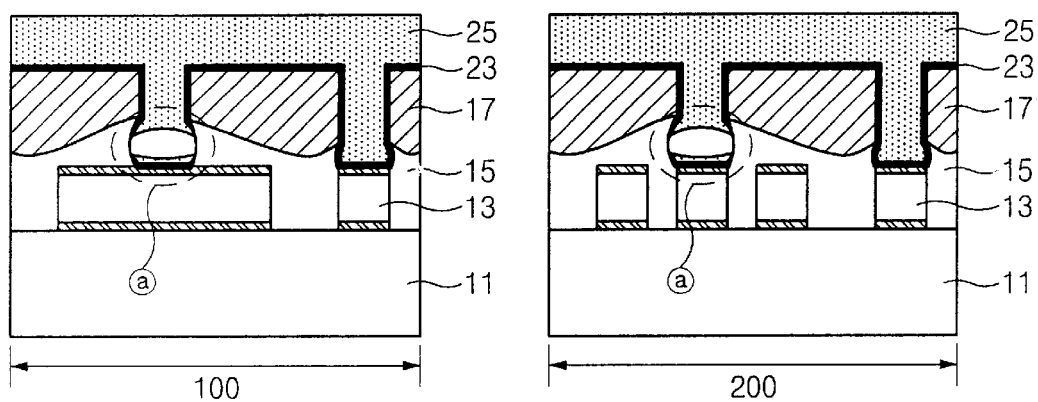
Figure 2A:
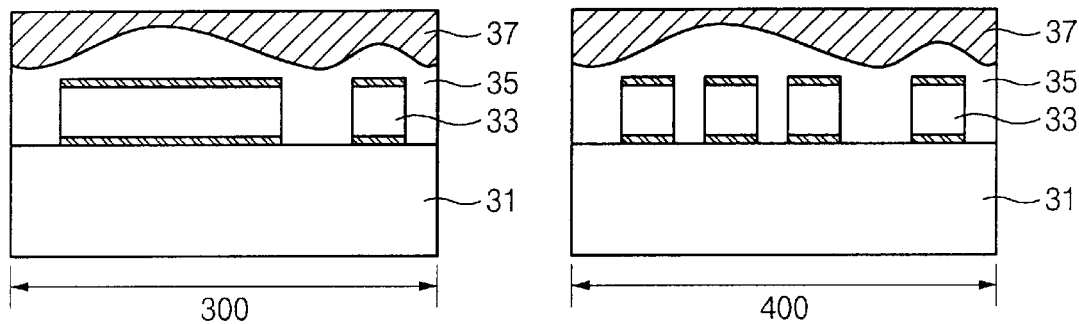
FIGS. 2a to 2d are cross-sectional views illustrating sequential steps of a method for forming a multi-layer metal line of a semiconductor device in accordance with a preferred embodiment of the present invention.

Referring to FIG. 2a, a lower metal line 33 is formed on a semiconductor substrate 31. Here, the lower metal line 33 is composed of an aluminum alloy, and has Ti or Ti/TiN stacked layer at the upper and lower portions of the lower metal line 33.

Reference numeral 300 denotes a region where the area of the lower metal line varies, and reference numeral 400 denotes a region where the density of the lower metal line varies. That is, a metal line having a large area is formed at the left side of region 300, and a metal line having a small area is formed at the right side thereof. A density of the metal line at the left side of the region 400 is relatively higher than that of the right side thereof.

Thereafter, a first insulating film 35 having a low dielectric constant is formed on the entire surface 33. Here, the first insulating film 35 is formed according to spin coating using a material having a dielectric constant of about 3 at a thickness of 4000 to 6000 Å.

Although the insulating film 35 has an excellent filling property between metals, namely high step coverage, it is not uniformly coated on the metal line due to its adhesiveness, but unevenly coated on the metal line depending on a width and density of the metal line.

In general, the first insulating film 35 is coated thicker on the metal line having large area than on the metal line having smaller area, and in the region having high metal line density than the region having low metal line density.

A first oxide film 37 is deposited on the first insulating film 35 according to plasma enhanced chemical vapor deposition (PECVD).

Here, the first oxide film 37 is preferably composed of a material having a dielectric constant of about 4 and has a thickness ranging from 5000 to 7000 Å.

Thereafter, a chemical mechanical polishing (CMP) is performed on the first oxide film 37 until a remaining portion of the first oxide film has a thickness ranging from 5000 to 7000 Å which is thinner than the oxide film 15 before the CMP process.

Figure 2B:
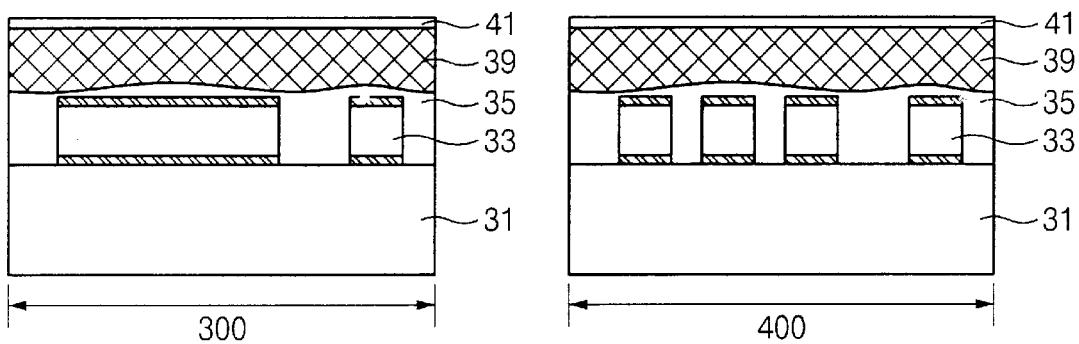

Referring to FIG. 2b, an etch back process is performed using CF group gas under a condition that an etch selectivity ratio of the first insulating film 35 to the first oxide film 37 is more than 2:1 so that the first oxide film 37 is removed, and a thickness of the first insulating film 35 according to a width and pattern density of the lower metal line 33 is minimized down to 500 to 1000 Å.

Here, the etch back process is performed in an equipment having an ion density of $1 \times 10^{10}$ ion/cm$^3$ under a pressure ranging from 1000 to 1500 mTorr, with a power ranging from 800 to 1200 watt, CHF$_3$ having a flow rate ranging from 40 to 60 sccm, CF$_4$ having a flow rate ranging from 100 to 150 sccm and Ar having a flow rate ranging from 1000 to 1500 sccm.

Thereafter, polymers generated during the etch back process are removed according to a cleaning process.

A second insulating film 39 having a low dielectric constant is formed and planarized on the entire surface of the resulting structure by a spin coating to have a thickness ranging from 6000 to 7000 Å.

A second oxide film 41 having a thickness ranging from 500 to 1000 Å is formed on the second insulating film 39.

Figure 2C:
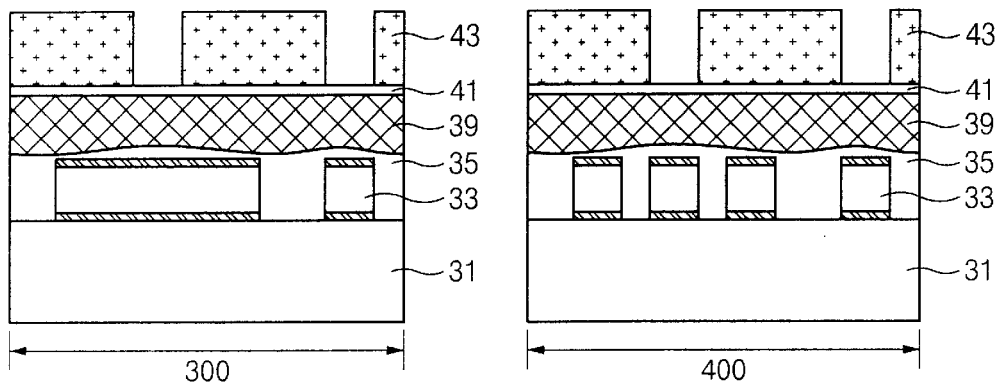

Referring to FIG. 2c, a photosensitive film pattern 43 is formed on the second oxide film 41.

Here, the photosensitive film pattern 43 is formed according to exposure and development processes using a via contact mask.

Figure 2D:
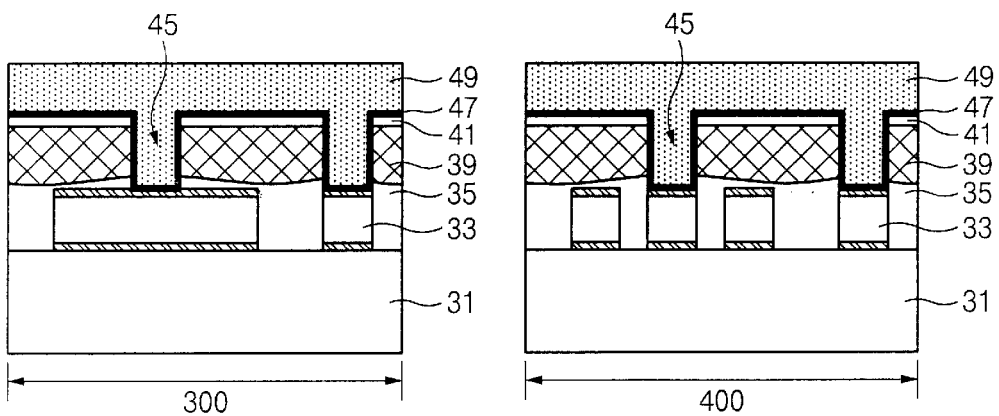

Referring to FIG. 2d, a via contact hole 45 exposing the lower metal line 33 is formed by etching the second oxide film 41, the second insulating film 39 and the first insulating film 35 using the photosensitive film pattern 43 as a mask.

The second oxide film 41 is etched in an equipment having an ion density of $1 \times 10^{10}$ ion/cm$^3$ under a pressure ranging from 30 to 50 mTorr, with a source power ranging from 1800 to 2200 watt, a bias power ranging from 1300 to 1600 watt, $CHF_3$ having a flow rate ranging from 20 to 30 sccm, $CF_4$ having a flow rate ranging from 50 to 80 sccm, Ar having a flow rate ranging from 400 to 600 sccm and $O_2$ having a flow rate ranging from 10 to 15 sccm.

The second and the first insulating films 39 and 35 are etched by a plasma-etching process using a fluorocarbon gas having a high C/F ratio such as $C_4F_8$ and a fluoromethane gas such as $CH_2F_2$ to expose the second insulating film 39. Here, a sidewall protective film of the via contact hole is preserved by controlling flow rate of oxygen. The fluorocarbon gas serves to generate a large amount of polymers, and the H in the fluoromethane gas serves to remove free fluorine generated by plasma.

The process for etching the first and the second insulating films 39 and 35 is performed under a pressure ranging from 30 to 50 mTorr, with a source power ranging from 1800 to 2200 watt, a bias power ranging from 1500 to 1700 watt, $C_4F_8$ having a flow rate ranging from 15 to 25 sccm, $CH_2F_2$ having a flow rate ranging from 5 to 10 sccm, Ar having a flow rate ranging from 400 to 600 sccm and $O_2$ having a flow rate ranging from 10 to 15 sccm.

Thereafter, a Ti/TiN film 47 which is an adhesive film/diffusion barrier film is formed on the entire surface of the resulting structure including the via contact hole 45 by a plasma enhanced chemical vapor deposition method.

A tungsten layer 49 filling a sidewall and bottom portion of the via contact hole 45 is formed on the entire surface of the resulting structure.

A contact plug (not shown) is formed by planarizing the tungsten layer 49, and an upper metal line (not shown) is formed to contact the contact plug.

As discussed earlier, in accordance with the present invention, the method for forming the multi-layer metal line of the semiconductor device provides improved characteristics and reliability of the semiconductor device and the high integration by forming a planarized insulating film having a low dielectric constant during the formation process of an interlayer insulating film on the lower metal line, forming a thin oxide film thereon, and performing the via contact etching process to form the via contact hole without generating bowing.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a multi-layer metal line of a semiconductor device, comprising the steps of (a) forming a first insulating film having a low dielectric constant on a semiconductor substrate having a lower metal line thereon; (b) forming and planarizing a first oxide film on the first insulating film; (c) etching back the first oxide film and the first insulating film until a predetermined thickness of first insulating film remains on the lower metal line; (d) forming and planarizing a second insulating film having a low dielectric constant on the entire surface of the resulting structure; (e) forming a second oxide film on the second insulating film; (f) selectively etching the second oxide film and the first and the second insulating films to form a via contact hole exposing the lower metal line; (g) forming an adhesive film/diffusion barrier film on the entire surface of the resulting structure; and (i) forming a contact plug filling the via contact hole, and forming an upper metal line contacting the contact plug.

2. The method according to claim 1, wherein, in the step (a), the first insulating film is formed as thick as 4000 to 6000 .ANG. by a spin coating process.

3. The method according to claim 1, wherein, the step (b), the first oxide film is formed as thick as 5000 to 7000 .ANG. by a plasma enhanced chemical vapor deposition.

4. The method according to claim 1, wherein, in the step (b), the planarization is performed by a chemical mechanical polishing process.

5. The method according to claim 1, wherein the step (c) is performed using fluorocarbon gas and the thickness of the first insulating film remaining after etch-back is ranging from 500 to 1000 .ANG.

6. The method according to claim 1, wherein the step (c) is performed in an equipment under the condition of an ion density of 1.times.10.sup.10 ion/cm.sup.3, a pressure ranging from 1000 to 1500 mTorr, a power ranging from 800 to 1200 watt, CHF.sub.3 having a flow rate ranging from 40 to 60 sccm, CF.sub.4 having a flow rate ranging from 100 to 150 sccm and Ar having a flow rate ranging from 1000 to 1500 sccm.

7. The method according to claim 1, further comprising a cleaning process after the step of etching back.

8. The method according to claim 1, wherein the step (d) is performed by a spin coating process to obtain a planarized second insulating film as thick as 6000 to 7000 .ANG.

9. The method according to claim 1, wherein the second oxide film of the step (e) is formed as thick as 500 to 1000 .ANG.

10. The method according to claim 1, wherein the process of etching the second oxide film of the step (f) is performed in an equipment on the condition of an ion density of 1.times.10.sup.10 ion/cm.sup.3, a pressure ranging from 30 to 50 mTorr, a source power ranging from 1800 to 2200 watt, bias power ranging from 1300 to 1600 watt, CHF.sub.3 having a flow rate ranging from 20 to 30 scorn, CF.sub.4 having a flow rate ranging from 50 to 80 sccm, Ar having a flow rate ranging from 400 to 600 scorn and O.sub.2 having a flow rate ranging from 10 to 15 scorn.

11. The method according to claim 1, wherein the etching process of the first and second oxide films of the step (f) is performed by a plasma etching process using a fluorocarbon gas having a high C/F ratio and a fluoromethane gas.

12. The method according to claim 1, wherein the etching process of the first and the second insulating films of the step (f) is performed under the condition of a pressure ranging from 30 to 50 mTorr, a source power ranging from 1800 to 2200 watt, a bias power ranging from 1500 to 1700 watt, $C_4F_8$ having a flow rate ranging from 15 to 25 sccm, $CH_2F_2$ having a flow rate ranging from 5 to 10 sccm, Ar having a flow rate ranging from 400 to 600 sccm and $O_2$ having a flow rate ranging from 10 to 15 sccm.

13. The method according to claim 1, wherein the adhesive film/diffusion barrier film of the step (g) comprises Ti/TiN film formed by a plasma enhanced chemical vapor deposition method.

\* \* \* \* \*